US009673361B2

(12) United States Patent
Toyama et al.

(10) Patent No.: US 9,673,361 B2
(45) Date of Patent: Jun. 6, 2017

(54) LIGHT-EMITTING APPARATUS WITH LEADS COATED WITH METAL FILMS

(71) Applicant: ROHM CO., LTD., Kyoto (JP)

(72) Inventors: Tomoichiro Toyama, Kyoto (JP); Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 13/752,569

(22) Filed: Jan. 29, 2013

(65) Prior Publication Data

US 2014/0042471 A1 Feb. 13, 2014

(30) Foreign Application Priority Data

Jan. 31, 2012 (JP) .................................. 2012-17914
Jan. 8, 2013 (JP) ...................................... 2013-836

(51) Int. Cl.
*H01L 33/62* (2010.01)
*H01L 33/56* (2010.01)
(Continued)

(52) U.S. Cl.
CPC .............. *H01L 33/56* (2013.01); *H01L 24/97* (2013.01); *H01L 33/60* (2013.01); *H01L 33/62* (2013.01);
(Continued)

(58) Field of Classification Search
CPC ..... H01L 33/62; H01L 33/0079; H01L 33/48; H01L 24/97; H01L 33/56; H01L 33/60; H01L 33/486; H01L 33/647; H01L 2224/45144; H01L 2224/48247; H01L 2224/49107; H01L 2224/73265; H01L 2924/12035; H01L 2924/12041;
(Continued)

(56) References Cited

U.S. PATENT DOCUMENTS 7,795,625 B2 * 9/2010 Suzuki ............................ 257/81
8,106,418 B2 * 1/2012 Bando ............................. 257/99
(Continued)

FOREIGN PATENT DOCUMENTS

JP 2006156704 6/2006
JP 2010-103149 5/2010
(Continued)

OTHER PUBLICATIONS

Japanese Office Action, issued in the corresponding Japanese Patent application No. 2013-000836, dated Mar. 14, 2017, 8 pages (machine translation is provided).

*Primary Examiner* — Cheung Lee
*Assistant Examiner* — Stephen C Smith
(74) *Attorney, Agent, or Firm* — Hamre, Schumann, Mueller & Larson, P.C.

(57) ABSTRACT

A light-emitting apparatus includes a light-emitting, a first lead, a second lead, and a resin molded body configured to support the first lead and the second lead. The main surfaces of the first and second leads includes first and second coverage areas covered by the resin molded body and first and second exposure regions exposed from the resin molded body at a window portion of the resin molded body, respectively. First and second metal layers are provided to cover main surfaces of the first and second leads at first and second exposure regions, respectively.

30 Claims, 6 Drawing Sheets

(51) Int. Cl.
  *H01L 33/60* (2010.01)
  *H01L 23/00* (2006.01)
  *H01L 33/48* (2010.01)
(52) U.S. Cl.
  CPC .. *H01L 33/486* (2013.01); *H01L 2224/45144* (2013.01); *H01L 2224/48247* (2013.01); *H01L 2224/49107* (2013.01); *H01L 2224/73265* (2013.01); *H01L 2924/12035* (2013.01); *H01L 2924/12041* (2013.01); *H01L 2924/15747* (2013.01); *H01L 2924/181* (2013.01); *H01L 2933/0033* (2013.01); *H01L 2933/0066* (2013.01)
(58) Field of Classification Search
  CPC ..... H01L 2924/15747; H01L 2924/181; H01L 2933/0033; H01L 2933/0066
  USPC .................................................. 257/79–100
  See application file for complete search history.

(56) References Cited

U.S. PATENT DOCUMENTS

| | | | | |
|---|---|---|---|---|
| 8,455,891 | B2* | 6/2013 | Lee | 257/88 |
| 8,564,011 | B2* | 10/2013 | Chang et al. | 257/99 |
| 8,610,143 | B2* | 12/2013 | Hayashi | H01L 33/62 |
| | | | | 257/103 |
| 2006/0113605 | A1* | 6/2006 | Currie | H01L 21/82380 |
| | | | | 257/368 |
| 2006/0267036 | A1* | 11/2006 | Lee | H01L 33/647 |
| | | | | 257/98 |
| 2007/0262332 | A1* | 11/2007 | Kong | 257/81 |
| 2009/0014745 | A1* | 1/2009 | Wang | H01L 33/58 |
| | | | | 257/98 |
| 2009/0050925 | A1* | 2/2009 | Kuramoto et al. | 257/100 |
| 2010/0200882 | A1* | 8/2010 | Kotani | C08G 59/3245 |
| | | | | 257/98 |
| 2011/0169033 | A1* | 7/2011 | Fukunaga | C07D 249/12 |
| | | | | 257/98 |
| 2011/0186873 | A1* | 8/2011 | Emerson | H01L 33/48 |
| | | | | 257/88 |
| 2012/0037944 | A1* | 2/2012 | Takine | H01L 33/60 |
| | | | | 257/98 |
| 2013/0049058 | A1* | 2/2013 | Kobayakawa | H01L 33/486 |
| | | | | 257/98 |

FOREIGN PATENT DOCUMENTS

| | | |
|---|---|---|
| JP | 2010-235756 | 10/2010 |
| JP | 4608294 B2 | 1/2011 |
| JP | 2011-119393 | 6/2011 |
| JP | 2012-004596 | 1/2012 |
| WO | 2008/111504 | 9/2008 |

* cited by examiner

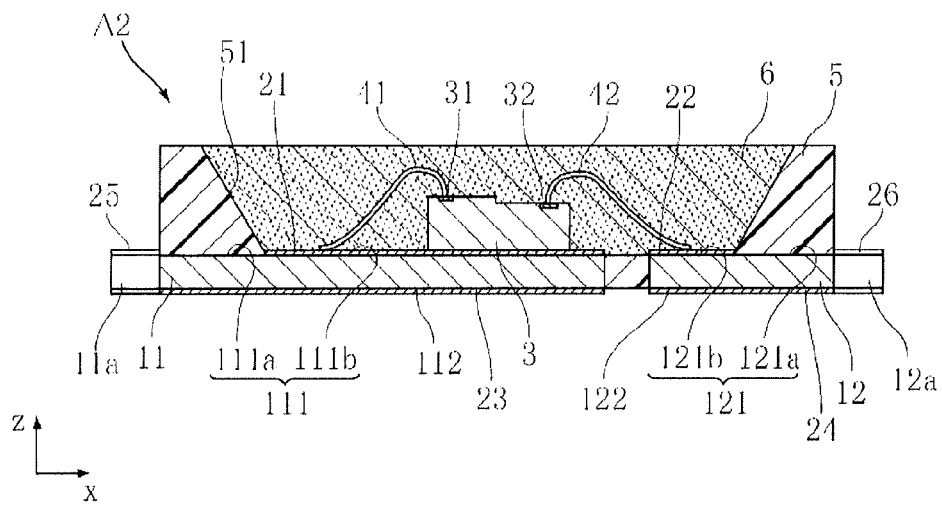
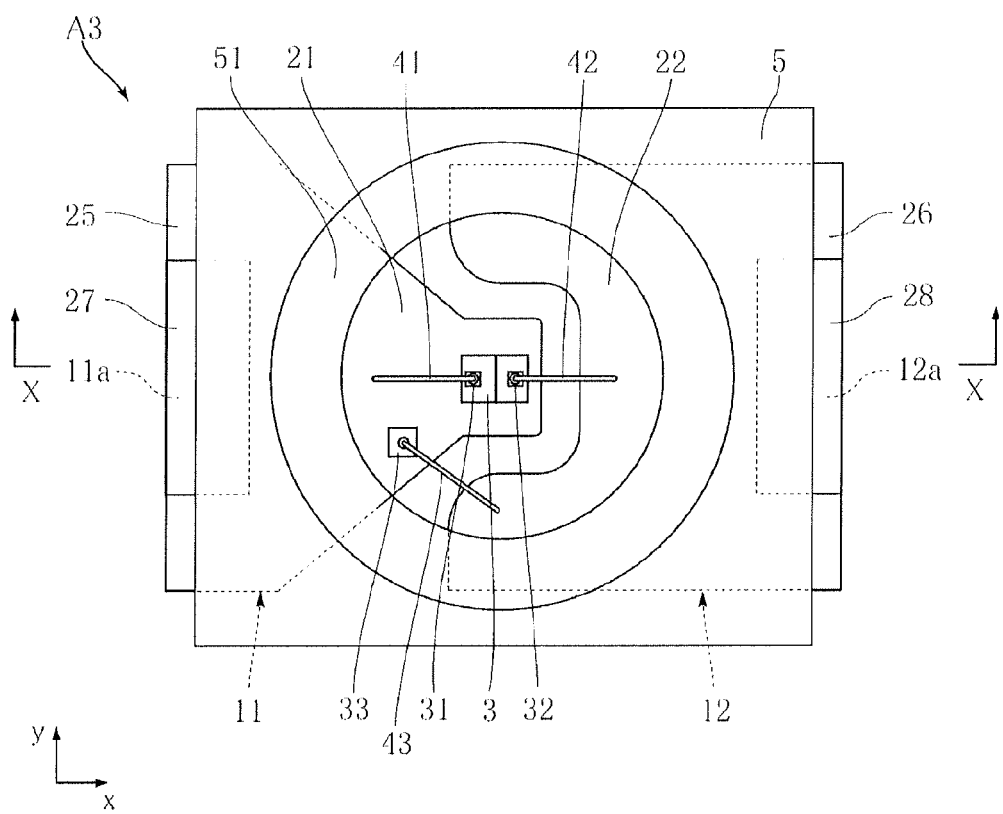

LIGHT-EMITTING APPARATUS WITH LEADS COATED WITH METAL FILMS

CROSS-REFERENCE TO RELATED APPLICATIONS

This application is based upon and claims the benefit of priority from Japanese Patent Application Nos. 2012-017914, filed on Jan. 31, 2012, and 2013-000836, filed on Jan. 8, 2013, the entire contents of which are incorporated herein by reference.

TECHNICAL FIELD

The present disclosure relates to a light-emitting apparatus used in a lighting equipment, a display, a backlight for a mobile phone, another common consumer light source or the like, and a manufacturing method thereof.

BACKGROUND

FIG. 11 shows an example of a conventional light-emitting apparatus. A semiconductor light-emitting device 90 shown in FIG. 11 includes leads 91 and 92 made of metal, a light-emitting element 93 mounted on the lead 91, a resin molded body 94 that supports the leads 91 and 92, and a light-transmitting member 95 that covers the light-emitting element 93. The resin molded body 94 is formed in some instances by a transfer molding method using a thermoset resin.

When forming the thermoset resin through the transfer molding method, the resin may protrude from fine gaps of a metallic pattern, thus causing burrs to occur. Therefore, a process for removing burrs is commonly used. For example, the use of high-pressure water flow after the formation of the resin molded body 94 can be used to remove burrs.

Copper in some instances is used for the leads 91 and 92 because it is easy to process and has a lower cost. When an improvement of performance of the light-emitting apparatus 90 is required, the main surfaces of the leads 91 and 92 made of copper is plated with a material, such as silver, which is an excellent medium for light reflection and thermal conductivity. However, the plating would be damaged during the process for removing burrs if performed after the resin molded body 94 is formed.

SUMMARY

The present disclosure was conceived under the background as described above. Some embodiments of the present disclosure provide a light-emitting apparatus which may be manufactured relatively easily and whose performance may be improved and a manufacturing method thereof.

A light-emitting apparatus according to a first embodiment of the present disclosure includes: a light-emitting element including a first electrode terminal and a second electrode terminal; a first lead having a main surface and a rear surface facing opposite directions, the light-emitting element being mounted on the main surface, the first lead electrically connected with the first electrode terminal; a second lead having a main surface and a rear surface facing opposite directions, the second lead electrically connected with the second electrode terminal; a light-transmitting member configured to cover the light-emitting element and transmit a light emitted from the light-emitting element; a resin molded body configured to support the first lead and the second lead. A window portion configured to accommodate the light-emitting element and the light-transmitting member is formed in the resin molded body. The main surface of the first lead includes a first coverage area covered by the resin molded body and a first exposure region exposed from the resin molded body at the window portion, the main surface of the second lead includes a second coverage region covered by the resin molded body and a second exposure region exposed from the resin molded body at the window portion, the main surface of the first lead at the first coverage region is in contact with the resin molded body, and the main surface of the second lead at the second coverage region is in contact with the resin molded body. The light-emitting apparatus further includes a first metal layer covering the main surface of the first lead at the first exposure region, and a second metal layer covering the main surface of the second lead at the second exposure region.

Such a configuration may well be obtained, for example, by forming the first and second metal layers on the main surfaces of the first and second leads exposed from the window portion after forming the resin molded body including the window portion. In other words, it is possible to form the first and second metal layers after forming the resin molded body and performing a process for eliminating burrs. Thus, it is possible to avoid the problem of the first and second metal layers being damaged during the burrs elimination process. Therefore, according to the light-emitting apparatus of the present disclosure, it is possible to form the first and second leads, for example, with copper or the like which is relatively easy to process and to adopt material, such as silver, that is excellent in light reflectance for the first and second metal layers, thus improving the performance without much burden.

In some embodiments, the first lead is electrically connected with the first electrode terminal via the first metal layer.

In some embodiments, the light-emitting apparatus further includes a first metal wire electrically connecting the first metal layer and the first electrode terminal.

In some embodiments, the first metal layer is in contact with the light-transmitting member.

In some embodiments, the second lead is electrically connected with the second electrode terminal via the second metal layer.

In some embodiments, the light-emitting apparatus further includes a second metal wire electrically connecting the second metal layer and the second electrode terminal.

In some embodiments, the second metal layer is in contact with the light-transmitting member.

In some embodiments, the first lead and the second lead are made of copper, and the first metal layer and the second metal layer are made of silver.

In some embodiments, the resin molded body is made of a thermoset resin.

In some embodiments, the thermoset resin is an unsaturated polyester resin.

In some embodiments, the thermoset resin includes a silicon resin.

In some embodiments, the rear surface of the first lead and the rear surface of the second lead are exposed from the resin molded body.

A manufacturing method of a light-emitting apparatus according to a second embodiment of the present disclosure includes: forming a lead frame having a main surface and a rear surface facing opposite directions; forming a resin molded body configured to support the lead frame, the resin molded body including a window portion exposing a portion of the main surface of the lead frame; providing a light-emitting element in the window portion; and covering the light-emitting element with a light-transmitting member transmitting a light emitted from the light-emitting element, wherein the forming a resin molded body includes performing an injection molding of a thermoset resin.

In some embodiments, the thermoset resin is formed of an unsaturated polyester resin.

In some embodiments, the manufacturing method further includes forming a metal layer configured to cover the main surface of the lead frame exposed from the window portion, between the forming a resin molded body and the providing a light-emitting element.

In some embodiments, the light-emitting element includes electrode terminals, and the electrode terminals and the metal layer are electrically connected when the light-emitting element is provided.

In some embodiments, the lead frame is made of copper, and the forming a metal layer is performed by plating the main surface of the lead frame with silver.

A manufacturing method of a light-emitting apparatus according to a third embodiment of the present disclosure includes: forming a lead frame having a main surface and a rear surface facing opposite directions; forming a resin molded body configured to support the lead frame, the resin molded body including a plurality of window portions exposing a portion of the main surface of the lead frame; providing a light-emitting element in each one of the plurality of window portions; covering the light-emitting element with a light-transmitting member configured to transmit a light emitted from the light-emitting element; and cutting the resin molded body, wherein the forming a resin molded body includes performing an injection molding of a thermoset resin.

In some embodiments, the thermoset resin is formed of an unsaturated polyester resin.

In some embodiments, the manufacturing method further includes forming a metal layer configured to cover the main surface of the lead frame exposed from the plurality of the window portions, between the forming a resin molded body and the providing a light-emitting element.

In some embodiments, the light-emitting element includes electrode terminals, and the electrode terminals of the light-emitting element and the metal layer are electrically connected when the light-emitting element is provided.

In some embodiments, the lead frame is made of copper; and the forming a metal layer is performed by plating the main surface of the lead frame with silver.

Other features and advantages of the present disclosure will become more apparent from the detailed description given below with reference to the accompanying drawings.

BRIEF DESCRIPTION OF THE DRAWINGS

FIG. 8 is a cross-sectional view showing a light-emitting apparatus according to a second embodiment of the present disclosure.

FIG. 9 is a plane view showing an essential portion of a light-emitting apparatus according to a third embodiment of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present invention(s). However, it will be apparent to one of ordinary skill in the art that the present invention(s) may be practiced without these specific details. In other instances, well-known methods, procedures, systems, and components have not been described in detail so as not to unnecessarily obscure aspects of the various embodiments.

Hereinafter, a preferred embodiment of the present disclosure will be described in detail with reference to the drawings.

Figure 1:
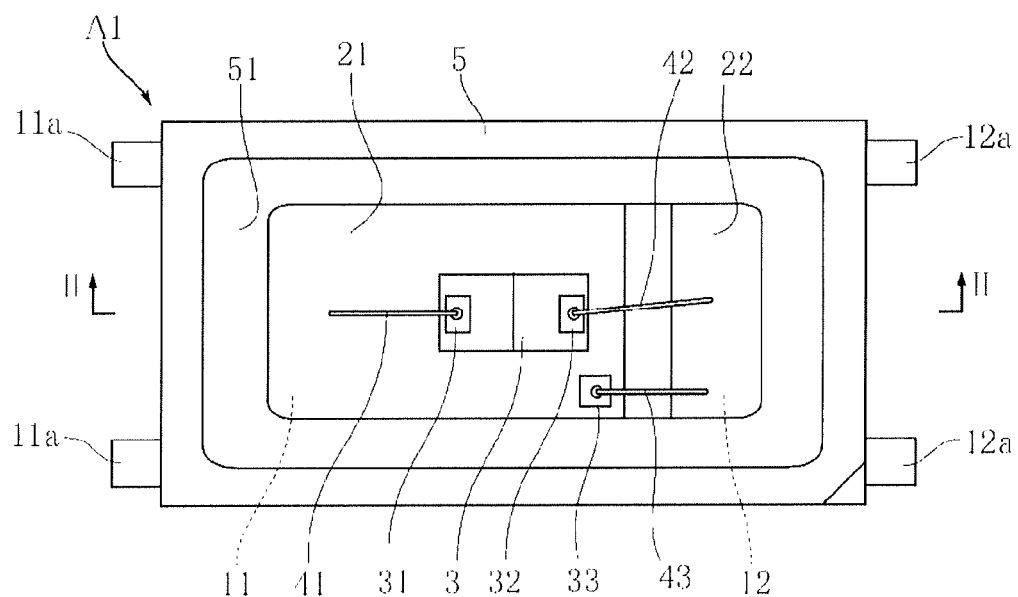
FIG. 1 is a plane view showing an essential portion of a light-emitting apparatus according to a first embodiment of the present disclosure.
Figure 2:
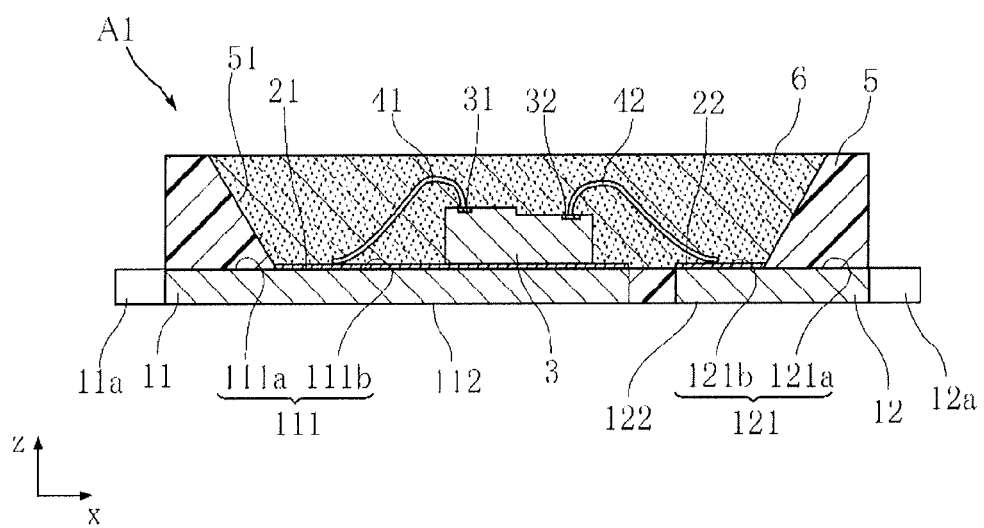
FIG. 2 is a cross-sectional view taken along the line II-II of FIG. 1.

FIGS. 1 and 2 show a light-emitting apparatus A1 according to a first embodiment of the present disclosure. The light-emitting apparatus A1 of the embodiment includes a first lead 11, a second lead 12, a first metal layer 21, a second metal layer 22, a light-emitting element 3, a Zener diode 33, a first wire 41, a second wire 42, a third wire 43, a resin molded body 5, and a light-transmitting member 6. For the convenience of understanding, the light-transmitting member 6 is omitted in FIG. 1. The light-emitting apparatus A1 is in the shape of an elongated rectangle as shown in the plane view of FIG. 1. In the following description, a longitudinal direction and a transverse direction of the light-emitting apparatus A1 are designated as x-direction and y-direction, respectively. In addition, a direction perpendicular to the x-direction and the y-direction is designated as z-direction. In some embodiments, the light-emitting apparatus A1 may be incorporated in a lighting equipment (not shown). The light-emitting apparatus A1 is mounted on and powered by an electronic circuit built in the lighting equipment to emit light.

Portions of the first lead 11 protrude from the left side of the resin molded body 5 as shown in FIG. 1 and portions of the second lead 12 protrude from the right side of the resin molded body 5. The resin molded body 5 forms an appearance of the light-emitting apparatus A1, as shown in FIGS. 1 and 2. A window portion 51 exposing a portion of the first lead 11 and a portion of the second lead 12 is formed in the middle of the resin molded body 5, as shown in the plane view of FIG. 1. The light-emitting element 3, the Zener diode 33, the first wire 41, the second wire 42, the third wire 43, and the light-transmitting member 6 are disposed in the window portion 51. The resin molded body 5 holds the first lead 11 and the second lead 12.

The first lead 11, for example, made of copper is formed approximately in the shape of an elongated plate which extends in the x-direction. The first lead 11 includes protruding portions 11a which protrude from the left end of the resin molded body 5 as shown in FIG. 1. The first lead 11 includes a main surface 111 and a rear surface 112 perpendicular to the z-direction, facing opposite from each other. As shown in FIG. 2, the main surface 111 faces upward and the rear surface 112 faces downward in the z-direction. The rear surface 112 of the first lead 11 is exposed from the resin molded body 5.

The main surface 111 includes a first coverage region 111a covered by the resin molded body 5 and a first exposure region 111b exposed from the resin molded body 5 through the window portion 51 as shown in FIG. 2. The first coverage region 111a of the main surface 111 is in contact with the resin molded body 5.

The first metal layer 21 is formed so as to cover the first exposure region 111b of the main surface 111. The first metal layer 21, for example, made of silver is laminated on the first exposure region 111b. As shown in FIG. 2, an upper surface of the first metal layer 21 is in contact with the light-transmitting member 6.

The second lead 12, made of silver, may be formed in the shape of the elongated plate which extends in the y-direction. The length along the y-direction of the second lead 12 is the same as the y-direction dimension of the first lead 11, and the x-direction dimension of the second lead 12 is shorter than the x-direction dimension of the first lead 11. The second lead 12 is disposed so as to be separated from the first lead 11 in the x-direction. More specifically, the second lead 12 is disposed on the right side of the first lead 11, as shown in FIGS. 1 and 2. A portion of the resin molded body 5 penetrates into a gap between the first lead 11 and the second lead 12. In addition, the second lead 12 includes portions 12a which protrude from the right end in FIG. 1 of the resin molded body 5. The second lead 12 includes a main surface 121 and a rear surface 122 perpendicular to the z-direction, facing opposite from each other. The main surface 121 faces upward and the rear surface 122 faces downward in the z-direction, as shown in FIG. 2.

As illustrated in FIG. 2, the main surface 121 includes a second coverage region 121a covered by the resin molded body 5 and a second exposure region 121b exposed from the resin molded body 5 through the window portion 51. The second coverage region 121a of the main surface 121 is in contact with the resin molded body 5.

The second metal layer 22 is formed so as to cover the second exposure region 121b of the main surface 121. The second metal layer 22, for example, formed of silver is laminated on the second exposure region 121b. An upper surface of the second metal layer 22 is in contact with the light-transmitting member 6, as shown in FIG. 2.

For example, the light-emitting element 3 is a light-emitting diode (LED) element having a structure in which an n-type semiconductor layer formed of GaN, an active layer and a p-type semiconductor layer are laminated. The light-emitting element 3 emits blue light, for example. The light-emitting element 3 is of rectangular shape and includes a first electrode terminal 31 and a second electrode terminal 32 on an upper surface of the light-emitting element 3 as shown in FIG. 2. In the example shown in FIG. 2, the second electrode terminal 32 is disposed in the right side of the first electrode terminal 31 with a space therebetween along the x-direction. The light-emitting element 3 is mounted on the main surface 111 of the first lead 11. More specifically, the light-emitting element 3 may be fixed on the upper surface of the first metal layer 21 as shown in FIG. 2, for example, by means of a bonding material (not shown). For example, a silver paste may be used as the bonding material.

The first electrode terminal 31 is electrically connected with the first metal layer 21 through the first wire 41, and the second electrode terminal 32 is electrically connected with the second metal layer 22 through a second wire 42. Therefore, the first electrode terminal 31 is electrically connected to the first lead 11 through the first wire 41 and the first metal layer 21, and the second electrode terminal 32 is electrically connected to the second lead 12 through the second wire 42 and the second metal layer 22. Given such configuration, the first electrode terminal 31 and the second electrode terminal 32 may be powered by mounting the rear surface 112 of the first lead 11 and the rear surface 122 of the second lead 12 on the electronic circuit (not shown). Thus, the light-emitting element 3 may emit light.

A portion of the light emitted from the light-emitting element 3 is reflected upward in the z-direction of FIG. 2 by the first metal layer 21 or the second metal layer 22.

The Zener diode 33 is provided on the first metal layer 21 to prevent excessive reverse voltage from being applied to the light-emitting element 3, as shown in FIG. 1. The Zener diode 33 is connected to the second metal layer 22 through the third wire 43.

The first wire 41, the second wire 42, and the third wire 43 are, for example, gold wires.

The resin molded body 5 is formed of, for example, white thermoset resin. The thermoset resin may include unsaturated polyester resin. As shown in FIGS. 1 and 2, the window portion 51 is formed in the resin molded body 5. The window portion 51 is formed approximately in the shape of rectangle whose longitudinal direction is in the x-direction when viewed from the z-direction. The window portion 51 is located in the center of the resin molded body 5. The area of the window portion 51 when viewed from the z-direction of FIG. 2 decreases as moving toward the z-direction downward. More specifically, the window portion 51 includes four slope surfaces surrounding the light-emitting element 3. Two of the four slope surfaces are indicated in FIG. 2. Both the slope surfaces indicated in FIG. 2 are formed so as to approach the light-emitting element 3 in the x direction, as they approach the first lead 11 in the z-direction, respectively. Those slope surfaces reflect the light emitted laterally (for example, the x-direction and the y-direction) from the light-emitting element 3 toward the outside (for example, upward in the z-direction of FIG. 2) of the resin molded body 5, thus improving the light intensity of the light-emitting element 3.

The resin molded body 5 may be white, for example, by mixing a titanium oxide pigment into the unsaturated polyester resin.

The light-transmitting member 6 is formed so as to cover the light-emitting element 3. The light-transmitting member 6 is made of a material that transmits light from the light-emitting element 3. As shown in FIG. 2, the light-transmitting member 6 fills the space inside the window portion 51, and also covers the first wire 41, the second wire 42, the third wire 43, the first metal layer 21, and the second metal layer 22 in this embodiment. More specifically, the light-transmitting member 6 is formed by, for example, mixing fluorescent material into transparent epoxy resin. For example, the fluorescent material is excited by blue light from the light-emitting element 3 to emit yellow light. White light is emitted from the light-emitting apparatus A1 by mixing the blue light from the light-emitting element 3 and the yellow light from the fluorescent material. In place of the above-described fluorescent material, the fluorescent material which is excited by the blue light to emit a red light and the fluorescent material emitting green light may be used together.

Next, a manufacturing method of the light-emitting apparatus A1 will be described with reference to FIGS. 3 to 7.

Figure 3:
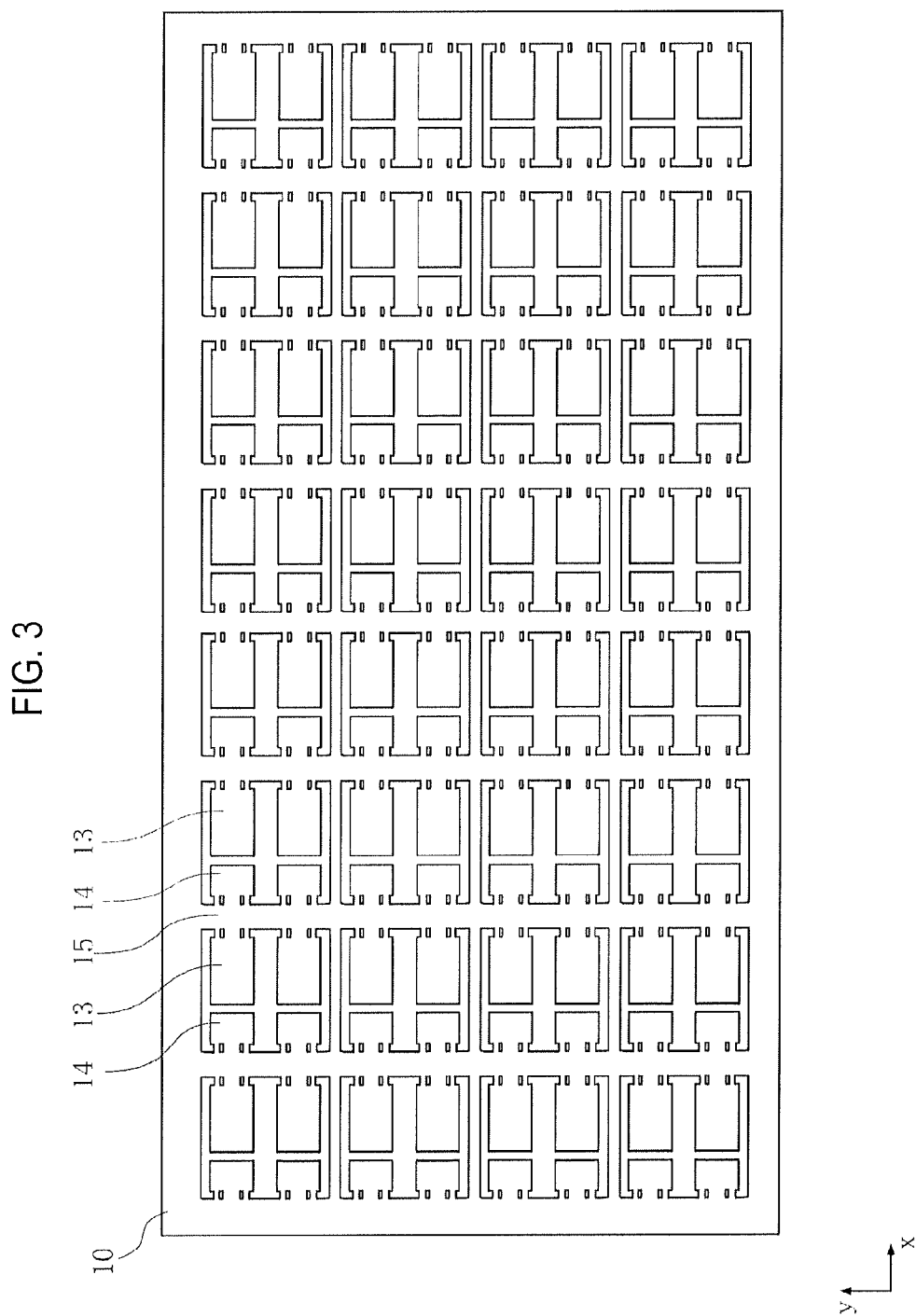
FIG. 3 is a diagram showing a lead frame produced in a manufacturing process of the light-emitting apparatus shown in FIG. 1.

FIG. 3 shows an example of a lead frame 10 used in manufacturing the light-emitting device A1. The lead frame 10 shown in FIG. 3 is formed by performing a process of punching on a sheet metal made of copper. The lead frame 10 is in a shape of a continuous hoop and includes a plurality of first island portions 13, a plurality of second island portions 14, and connecting portions 15 configured to connect the plurality of first island portions 13 and the plurality of second island portions 14. The dimension of the second island portion 14 in the x-direction is shorter than that of the first island portion 13. Each of the first island portions 13 is connected to the connecting portion 15 on one side and is separated from the second island portions 14 with a predetermined interval in between in the x-direction. The lead frame 10 includes a main surface and a rear surface facing opposite directions in the z-direction.

In manufacturing the light-emitting apparatus A1, the above-described process of forming the lead frame 10 is performed first, and then a process of forming a resin molded body 50 covering a portion of the lead frame 10 is performed. The process of forming the resin molded body 50 includes a process of performing an injection molding of the thermoset resin.

Figure 4:
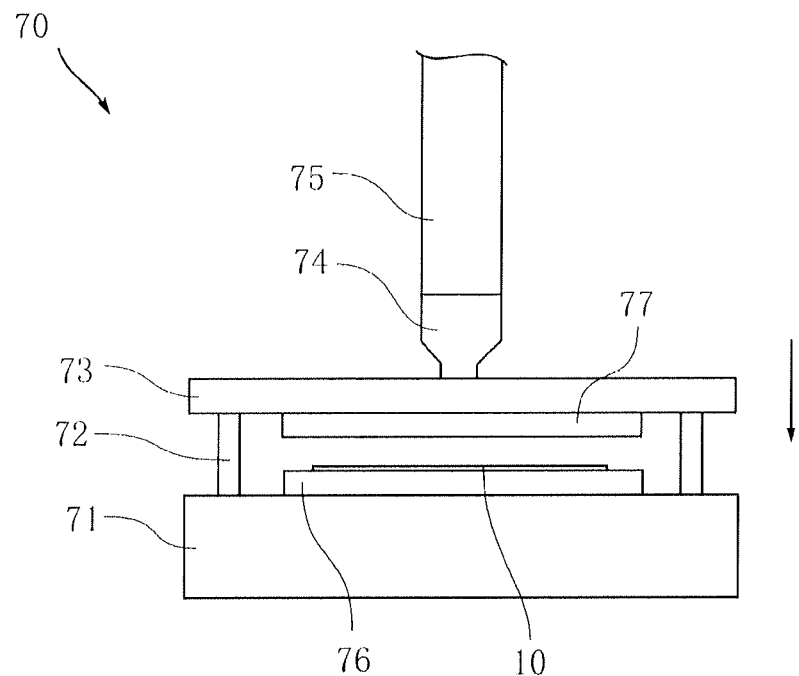
FIG. 4 is a diagram showing a part of the manufacturing process of the light-emitting apparatus shown in FIG. 1.

The process of performing the injection molding of the thermoset resin is carried out, for example, using an injection molding apparatus 70 whose main part is shown briefly in FIG. 4. The injection molding apparatus 70 includes a fixed portion 71, a tie bar 72, a movable portion 73, an injection nozzle 74, a cylinder 75, and metallic patterns 76 and 77. The metallic pattern 76 is provided on the fixed portion 71, and the metallic pattern 77 is provided on the movable portion 73. The fixed portion 71 and the movable portion 73 are connected through the tie bar 72, and the movable portion 73 is movable up and down in FIG. 4, while holding the metallic pattern 77. The metallic patterns 76 and 77 may be put together by moving the movable portion 73 downward from the position shown in FIG. 4. The injection nozzle 74 is connected to the cylinder 75. The cylinder 75 is supplied with liquid resin material and curing agent which cures the resin material. The resin material to which the curing agent is added in the cylinder 75 is sent to the injection nozzle 74 promptly, and then fed to the metallic patterns 76 and 77.

Figure 5:
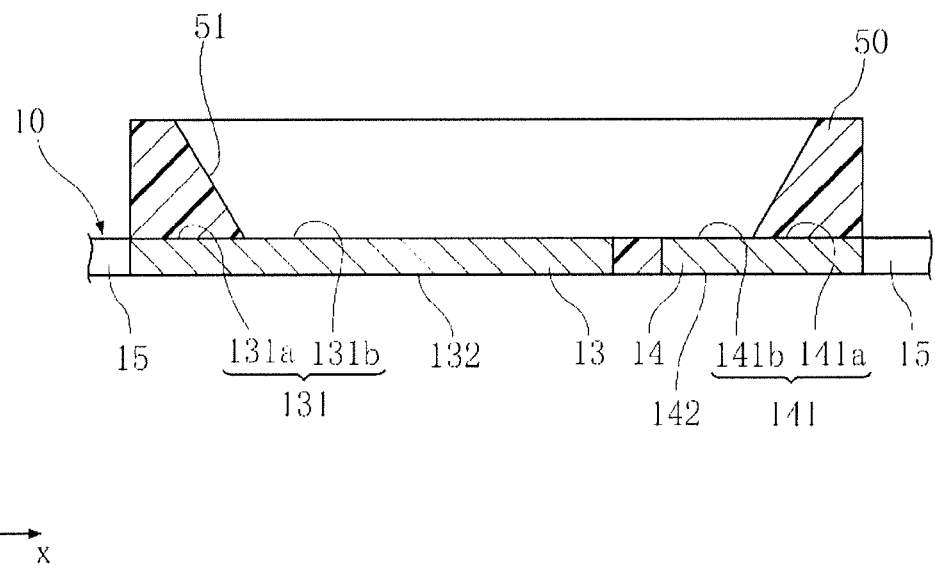
FIG. 5 is a diagram showing an article produced according to the process of FIG. 4.

The resin material supplied to the injection nozzle 74 may be the thermoset resin, more specifically, the unsaturated polyester resin in this process. The lead frame 10 is provided on the metallic pattern 76 and is sandwiched between the metallic pattern 76 and the metallic pattern 77 by pressing the movable portion 73 downward. The metallic pattern 76 includes, for example, a flat bottom surface, and the lead frame 10 is provided on the metallic pattern 76 so that a rear surface of the lead frame 10 may be in contact with the bottom surface. The metallic pattern 77 is formed to have unevenness and a plurality of convex portions which are brought into contact with the main surface of the lead frame 10 when the metallic pattern 76 and the metallic pattern 77 are put together by pressing the movable portion 73 downward. Using these metallic patterns 76 and 77, the resin molded body 50 may be formed so as to include a plurality of window portions 51 exposing a portion of the main surface of the lead frame 10. FIG. 5 shows portions of the lead frame 10 and the resin molded body 50 corresponding to the light-emitting apparatus A1. The first island portion 13 will become the first lead 11 and the second island portion 14 will become the second lead 12 later on.

As shown in FIG. 5, a portion of the main surface 131 of the first island portion 13 in the lead frame 10 is covered with the resin molded body 50. This region designated as 131a will become the first coverage region 111a later on. In addition, a portion of the main surface 131 is exposed from the resin molded body 50 at the window portion 51. This region designated as 131b will become the first exposure region 111b later on. On the other hand, a rear surface 132 of the first island portion 13 is exposed from the resin molded body 50. The rear surface 132 of the first island portion 13 will become the rear surface 112 of the first lead 11 later on.

As shown in FIG. 5, a portion of a main surface 141 of the second island portion 14 of the lead frame 10 is covered with the resin molded body 50. This region designated as 141a will be the second coverage region 121a later on. In addition, a portion of the main surface 141 is exposed from the resin molded body 50 at the window portion 51. This region designated as 141b will become the second exposure region 121b later on. A rear surface 142 of the second island portion 14 will become the rear surface 122 of the second lead 12 later on.

After the resin molded body 50 is formed, a process of eliminating burrs is performed, and then a process of forming a metal layer is performed.

The process of forming a metal layer is carried out, for example, by performing silver plating on the lead frame 10. The metal layer is not formed on the region covered with the resin molded body 50. In addition, even in the portion exposed from the resin molded body 50, the plating may be selectively performed on a required region by covering the portion of which the metal layer is not required with resins or the like in advance.

Figure 6:
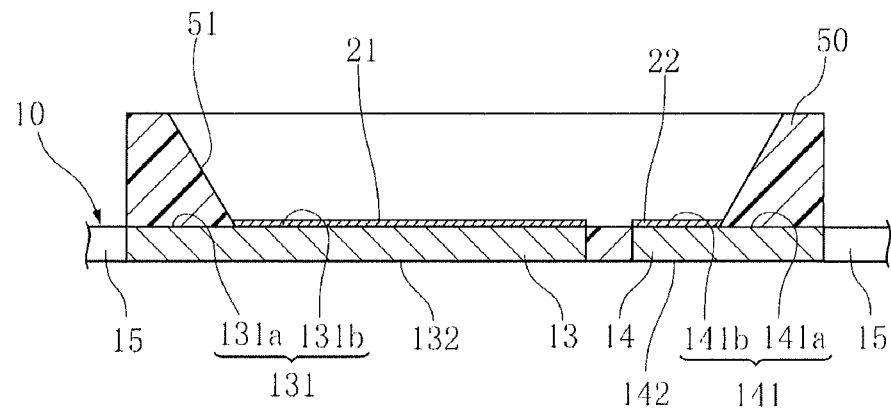
FIG. 6 is a diagram showing an article produced according to process subsequent to that of FIG. 4.

As shown in FIG. 6, the first metal layer 21 is formed on the region 131b of the main surface 131, and the second metal layer 22 is formed on the region 141b of the main surface 141 in this process.

After the metal layer is formed, a process of providing a plurality of light-emitting elements 3 on the lead frame 10 is performed. Each light-emitting element 3 is provided on a corresponding portion of the first island portions 13 in this process. More specifically, one light-emitting element 3 is provided on the region 131b exposed from the window portion 51 of each first island portion 13. Since the first metal layer 21 is formed on the region 131b in the previous process, a silver paste is provided on a predetermined position of the first metal layer 21, and the light-emitting element 3 is introduced on the silver paste in this process. In addition, the Zener diode 33 is also provided in this process.

Figure 7:
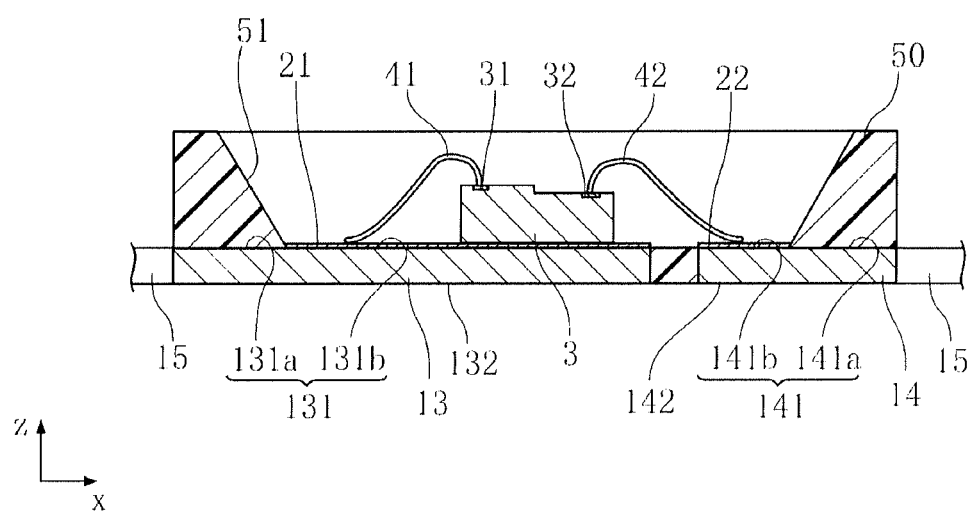
FIG. 7 is a diagram showing the light-emitting element provided on the article shown in FIG. 6.

Further, a process of forming the first wire 41, the second wire 42, and the third wire 43 is followed. In this process, a wire bonding is performed for each of a plurality of light-emitting elements 3 and a plurality of Zener diodes 33. FIG. 7 shows a state after the first wire 41 and the second wire 42 of the light-emitting apparatus A1 are formed.

After the first wire 41, the second wire 42, and the third wire 43 are provided, a process of filling each of a plurality of window portions 51 with light-transmitting resin is performed. The liquid light-transmitting resin used in this process is cured to become the light-transmitting member 6. After this process, a process of cutting the connecting portion 15 of the lead frame 10 to remove unnecessary portions of the resin molded body 50 is performed. In this process, each of the plurality of first island portions 13 becomes the first lead 11, and each of the plurality of second island portions 14 becomes the second lead 12. Further, the resin molded body 50 is divided into a plurality of resin molded bodies 5. In addition, remaining portions after cutting the connecting portion 15 become protruding portions 11a and 12a.

As described above, a plurality of light-emitting devices A1 can be manufactured at once.

Subsequently, effects of the light-emitting apparatus A1 and the manufacturing method thereof will be described.

Most of the region of the first lead 11 and the second lead 12 exposed from the window portion 51 is covered by the first metal layer 21 and the second metal layer 22 in the light-emitting apparatus A1. The first metal layer 21 and the second metal layer 22 are made of silver, which is an excellent medium for the light reflectance and the thermal conductivity compared with the first lead 11 and the second lead 12 made of copper. Therefore, the light-emitting apparatus A1 has a high efficiency of emitting light and ability to dissipate heat emitted from the light-emitting element 3 more quickly, as compared with the case in which the first metal layer 21 and the second metal layer 22 are not provided on the first lead 11 and the second lead 12.

According to the manufacturing method as described above, the first metal layer 21 and the second metal layer 22 are formed after forming the resin molded body 50 and removing burr. Therefore, the first metal layer 21 and the second metal layer 22 may be obtained in better condition, without being damaged by the process for removing burrs. Accordingly, the light-emitting apparatus A1 can be improved in its performance by performing the silver plating while using the lead frame 10 made of copper which is easy to process and inexpensive.

Further, in the above-described manufacturing method, when the lead frame 10 in the shape of the continuous hoop is used, it is possible to produce a plurality of light-emitting apparatuses A1 at once. Therefore, according to the above-described manufacturing method, it is possible to reduce manufacturing cost of the light-emitting apparatus A1 by performing mass production.

The metallic patterns 76 and 77 which fit the lead frame 10 in the shape of the continuous hoop are relatively large. In case of pouring the resin material added with the curing agent into the large metallic patterns 76 and 77, the resin material may start to cure in the course of pouring the resin material. Therefore, it is necessary to pour the resin material into the metallic patterns 76 and 77 as soon as possible. The injection molding of the thermoset resin is performed in the above-described method of manufacturing the light-emitting apparatus A1, and the injection molding is suitable for pouring the resin material as soon as possible when using the large metallic patterns 76 and 77.

Figure 10:
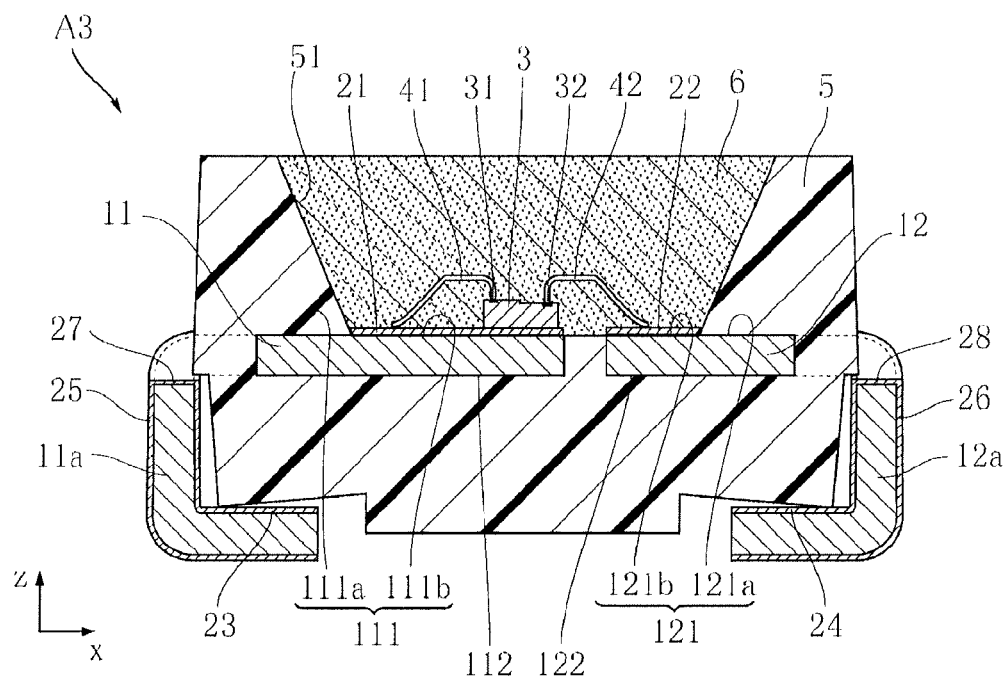
FIG. 10 is a cross-sectional view taken along the line X-X of FIG. 9.
Figure 11:
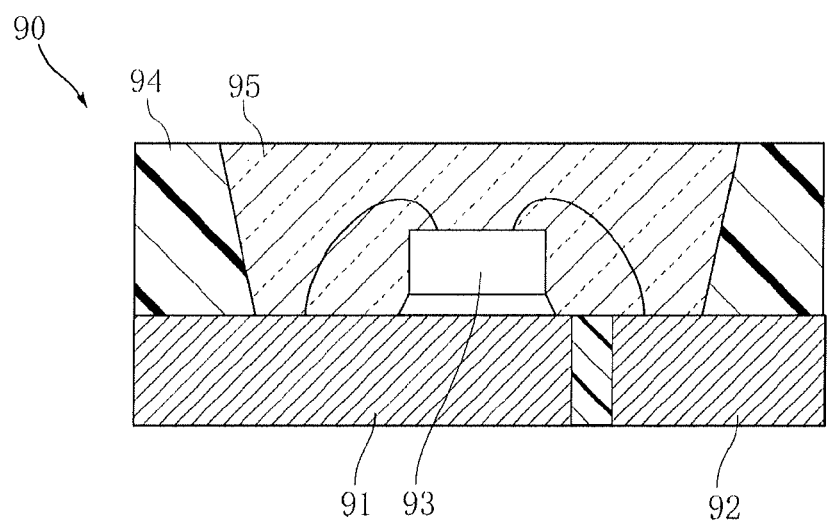
FIG. 11 is a diagram schematically showing one example of a conventional light-emitting apparatus.

FIGS. 8 to 10 illustrate other embodiments of the present disclosure. In FIGS. 8 to 10, elements identical or similar to those in the above-described embodiment are denoted by the same reference numerals used in the above-described embodiment.

FIG. 8 shows a light-emitting device A2 according to a second embodiment of the present disclosure. The light-emitting device A2 of the second embodiment is different from the above-described light-emitting apparatus A1 in that additional metal layers other than the first metal layer 21 and the second metal layer 22 are provided on the first lead 11 and the second lead 12.

In the second embodiment, the rear surface 112 of the first lead 11 is covered by a metal layer 23. In addition, an upper surface in the z-direction of the protruding portion 11a is covered by a metal layer 25, as shown in FIG. 8. On the other hand, a left end surface in the x-direction of the protruding portion 11a is not covered by the metal layer.

The rear surface 122 of the second lead 12 is covered by a metal layer 24. In addition, an upper surface in the z-direction of the protruding portion 12a is covered by a metal layer 26, as shown in FIG. 8. On the other hand, a right end surface in the x-direction of the protruding portion 12a is not covered by the metal layer.

A resin coating film with which the first island portion 13, the second island portion 14 and the connecting portion 15 are masked in the plating process of the manufacturing method of the light-emitting apparatus A1 shown in FIG. 6 is not formed in manufacturing processes of the light-emitting apparatus A2. Therefore, the plating process is applied to all exposed portions of the first island portion 13, the second island portion 14, and the connecting portion 15. As a result, the above-described metal layers 23, 24, 25 and 26 are formed. Front end surfaces of the protruding portions 11a and 12a shown in FIG. 8 are not yet formed in the plating process shown in FIG. 6. Therefore, these front end surfaces are exposed, without being covered by the metal layer.

According to this embodiment, it is also possible to have the high efficiency of light extraction to the outside and dissipate the heat emitted from the light-emitting element 3 more quickly.

FIGS. 9 and 10 show a light-emitting apparatus A3 according to a third embodiment of the present disclosure. The light-emitting apparatus A3 of the third embodiment is different from the above-described light-emitting apparatuses A1 and A2 mainly in that configurations of the resin molded body 5, the first lead 11, and the second lead 12 are different from those of the light-emitting apparatuses A1 and A2.

The resin molded body 5 includes a portion covering the rear surface 112 of the first lead 11 and the rear surface 122 of the second lead 12 in the third embodiment. The portion of the resin molded body 5 covering the rear surfaces 112 and 122 has a length approximately equal to that of the window portion 51 in the z-direction dimension and its central portion in the x-direction slightly bulges downward in the z-direction.

In the third embodiment, the protruding portions 11a and 12a extend from side surfaces of the resin molded body 5, and then bent downward in the z-direction, and further bent inward in the x-direction, as shown in FIG. 10. Thus, the protruding portions 11a and 12a wrap around the portion covering the rear surfaces 112 and 122 of the resin molded body 5 to reach a position lower than that of the resin molded body 5 in the z-direction. End portions of the protruding portions 11a and 12a are used as mounting terminals for mounting the light-emitting apparatus A3. In addition, the portions of the protruding portions 11a and 12a bent at the position where the protruding portions 11a and 12a protrude from the resin molded body 5 have openings at their central portions in the y-direction. With this configuration, the force required for bending the protruding portions 11a and 12a may be reduced.

The metal layers 23, 25, and 27 are laminated on the protruding portion 11a. The metal layer 23 covers a portion of the protruding portion 11a connected to the rear surface 112. The metal layer 25 covers a portion of the protruding portion 11a connected to the main surface 111. The metal layer 27 covers an inner surface of the above-described opening of the protruding portion 11a. On the other hand, an end surface of the protruding portion 11a is not covered by the metal layer.

The metal layers 24, 26, and 28 are laminated on the protruding portion 12a. The metal layer 24 covers a portion of the protruding portion 12a connected to the rear surface 122. The metal layer 26 covers a portion of the protruding portion 12a connected to the main surface 121. The metal layer 28 covers an inner surface of the above-described opening of the projecting portion 12a. On the other hand, an end surface of the protruding portion 12a is not covered by the metal layer.

According to this embodiment, it is also possible to have the high efficiency of light extraction to the outside and dissipate the heat emitted from the light-emitting element 3 more quickly.

The light-emitting apparatus according to the present disclosure is not limited to the embodiments described above. Various design changes may be made to the specific configuration of the light-emitting apparatus according to the present disclosure.

The above-described light-emitting apparatus A1 is a so-called two-wire type apparatus, but one-wire type apparatus or another type of apparatus where the light-emitting element 3 is flip-chip mounted may also be used.

The unsaturated polyester resin is illustrated as an example of the thermoset resin for forming the resin molded body 5 in the above-described light-emitting apparatus A1, but the thermoset resin is not limited thereto. For example, the resin molded body 5 may be formed of epoxy resin. Further, the thermoset resin for forming the resin molded body 5 may include silicon resin.

While certain embodiments have been described, these embodiments have been presented by way of example only, and are not intended to limit the scope of the inventions. Indeed, the embodiments herein may be embodied in a variety of other forms. Furthermore, various omissions, substitutions and changes in the form of the embodiments described herein may be made without departing from the spirit of the inventions. The accompanying claims and their equivalents are intended to cover such forms or modifications which would fall within the scope and spirit of the inventions.

What is claimed is:

1. A light-emitting apparatus comprising:
    a light-emitting element having a first electrode terminal and a second electrode terminal;
    a first lead having a main surface facing a direction from which a light is emitted from the light-emitting element and a rear surface facing an opposite direction, the light-emitting element being mounted on the main surface, the first lead electrically connected with the first electrode terminal;
    a second lead having a main surface and a rear surface facing the opposite direction, the second lead electrically connected with the second electrode terminal;
    a light-transmitting member configured to cover the light-emitting element and transmit a light emitted from the light-emitting element; and
    a resin molded body configured to support the first lead and the second lead, wherein
    a window portion configured to accommodate the light-emitting element and the light-transmitting member is formed in the resin molded body,
    wherein the main surface of the first lead includes a first coverage area covered by the resin molded body and making a direct contact with the resin molded body throughout an entire portion of the first coverage area, and a first exposure region exposed from the resin molded body at the window portion, and the first lead includes a first protruding portion protruding from an inside of the resin molding body beyond an outer boundary of the resin molded body,
    the main surface of the second lead includes a second coverage region covered by the resin molded body and a second exposure region exposed from the resin molded body at the window portion, the main surface of the first lead at the first coverage region is in direct contact with the resin molded body,
    the main surface of the second lead at the second coverage region is in direct contact with the resin molded body,
    the light-emitting apparatus further includes a first metal layer which is formed on the first exposure region of the main surface of the first lead, a second metal layer which is formed on the second exposure region of the main surface of the second lead, and a third metal layer which is formed on the first protruding portion extending from the main surface of the first lead,
    the first protruding portion extending from the main surface of the first lead is covered by the third metal layer and the first protruding portion extending from the rear surface of the first lead is covered by a fifth metal layer, without covering an end surface of the first protruding portion, and
    one end of the first metal layer and one end of the second metal layer make contact with the window portion formed in the resin molded body, and the main surface of the first lead and the main surface of the second lead extends beyond the window portion.

2. The light-emitting apparatus of claim 1, wherein the first lead is electrically connected with the first electrode terminal via the first metal layer.

3. The light-emitting apparatus of claim 2, further comprising a first metal wire electrically connecting the first metal layer and the first electrode terminal.

4. The light-emitting apparatus of claim 1, wherein the first metal layer is in contact with the light-transmitting member.

5. The light-emitting apparatus of claim 1, wherein the second lead is electrically connected with the second electrode terminal via the second metal layer.

6. The light-emitting apparatus of claim 5, further comprising a second metal wire electrically connecting the second metal layer and the second electrode terminal.

7. The light-emitting apparatus of claim 1, wherein the second metal layer is in contact with the light-transmitting member.

8. The light-emitting apparatus of claim 1, wherein the first lead and the second lead are made of copper, and the first metal layer and the second metal layer are made of silver.

9. The light-emitting apparatus of claim 1, wherein the resin molded body is made of a thermoset resin.

10. The light-emitting apparatus of claim 9, wherein the thermoset resin is an unsaturated polyester resin.

11. The light-emitting apparatus of claim 9, wherein the thermoset resin includes a silicon resin.

12. The light-emitting apparatus of claim 1, wherein the rear surface of the first lead and the rear surface of the second lead are exposed from the resin molded body.

13. The light-emitting apparatus of claim 1, further comprising a diode provided on the first metal layer and electrically connected to the second metal layer.

14. The light-emitting apparatus of claim 1,
wherein the first lead and the second lead are formed in the shape of an elongated plate which extends in longitudinal direction,
wherein the first protruding portion which protrudes from the left end of the resin molded body when viewed from the top, and
wherein the second lead further includes second protruding portion which protrudes from the right end of the resin molded body when viewed from the top, and the second protruding portion being covered by a fourth metal layer.

15. The light-emitting apparatus of claim 14, wherein the second protruding portion is partially covered by the fourth metal layer without covering an end surface of the second protruding portion.

16. The light-emitting apparatus of claim 1, wherein the light-emitting apparatus further includes a sixth metal layer covering the second protruding portion connected to the rear surface of the second lead.

17. A light-emitting device package comprising:
a LED chip;
an annular support having an opening accommodating the LED chip, and surrounding the LED chip;
a first lead extending in longitudinal direction from an inside of the opening beyond an outer boundary of the annular support in a plan view, and including a first region located in the inside of the opening, a second region overlapping the annular support and making direct contact with the annular support, and a third region extending from the second region beyond the outer boundary of the annular support;
a first metal layer selectively formed on at least one of a main surface of the first region and a main surface of the third region without being formed on the second region which makes a direct contact with the annular support; and
a third metal layer formed on a rear surface of the third region,
wherein the first and third metal layers are formed without covering an end surface of the third region.

18. The light-emitting device package of 17, wherein the LED chip includes a first electrode terminal which is electrically connected to the first metal layer.

19. The light-emitting device package of 18, further comprising a first metal wire electrically connecting the first metal layer and the first electrode terminal.

20. The light-emitting device package of 17, wherein the LED chip is formed on the first lead.

21. The light-emitting device package of 17, wherein the LED chip is formed on the first region of the first lead.

22. The light-emitting device package of 17, wherein the first metal layer is made of silver.

23. The light-emitting device package of 17, further comprising:
a second lead extending in longitudinal direction from an inside of the opening beyond an outer boundary of the annular support, and including a fourth region located in the inside of the opening, a fifth region overlapping the annular support and making direct contact with the annular support, and a sixth region extending from the fifth region beyond the outer boundary of the annular support;
a second metal layer selectively formed on at least one of a main surface of the fourth region and a main surface of the sixth region without being formed on the fifth region which makes a direct contact with the annular support; and
a fourth metal layer formed on a rear surface of the sixth region,
wherein the second and fourth metal layers are formed without covering an end surface of the sixth region.

24. The light-emitting device package of 23, wherein the LED chip includes a second electrode terminal which is electrically connected to the second metal layer.

25. The light-emitting device package of 24, further comprising a second metal wire electrically connecting the second metal layer and the second electrode terminal.

26. The light-emitting device package of 25, wherein the LED chip formed on the first lead includes a first electrode terminal, and is electrically connected to the first lead and a first metal wire,
the LED chip includes a first side and a second side shorter than the first side in a plan view, and a direction to which the first side extends is substantially the same as a direction to which the first metal wire and the second metal wire extends from the LED chip.

27. The light-emitting device package of 24, wherein the second metal layer is made of silver.

28. The light-emitting device package of 17, wherein the opening of the annular support has a circular shape in a plan view.

29. The light-emitting device package of 17, wherein a width of the opening of the annular support increases as a distance from the first lead increases in a plan view.

30. The light-emitting device package of 17, further comprising a light-transmitting member covering a region of the annular support which surrounds the LED chip.

* * * * *